United States Patent [19]

Shimada et al.

[11] Patent Number: 5,594,259
[45] Date of Patent: Jan. 14, 1997

[54] SEMICONDUCTOR DEVICE AND A METHOD FOR PRODUCING THE SAME

[75] Inventors: Yasunori Shimada, Nara; Masahito Goto, Tenri; Hisashi Saito, Nara; Koji Taniguchi, Tenri, all of Japan

[73] Assignee: Sharp Kabushiki Kaisha, Osaka, Japan

[21] Appl. No.: 338,195

[22] Filed: Nov. 9, 1994

Related U.S. Application Data

[63] Continuation of Ser. No. 935,439, Aug. 26, 1992, abandoned.

[30] Foreign Application Priority Data

Aug. 29, 1991 [JP] Japan .................................. 3-219031

[51] Int. Cl.⁶ ........................................................ H01L 29/76
[52] U.S. Cl. ................................................ 257/66; 257/761
[58] Field of Search ........................... 257/761, 32, 66

[56] References Cited

U.S. PATENT DOCUMENTS

| 3,754,168 | 8/1973 | Cunningham et al. | 257/761 |
|---|---|---|---|
| 4,432,134 | 2/1984 | Jones et al. | 257/32 |
| 4,523,811 | 6/1985 | Ota | 350/333 |
| 4,563,695 | 1/1986 | Tarutani et al. | 257/35 |
| 4,589,961 | 5/1986 | Gershenson | 257/32 |
| 4,673,968 | 6/1987 | Hieber et al. | 257/757 |
| 4,860,067 | 8/1989 | Jackson et al. | 257/190 |
| 4,954,870 | 9/1990 | Takemura et al. | 257/761 |
| 5,264,728 | 11/1993 | Ikeda et al. | 257/412 |

FOREIGN PATENT DOCUMENTS

0273743 6/1988 European Pat. Off. .
62-205656 9/1987 Japan .
2-106723 4/1990 Japan .

OTHER PUBLICATIONS

Periodic Chart, Side 2, Sargent–Welch Scientific Company, 1980.
Cole et al., "Bistable Resistance Memory Cell" IBM Tech Disc Bull. vol. 15, No. 6, Nov. 1972, pp. 2015–2016.
L. G. Feinstein et al., Thin Solid Films, 16 (1973) pp. 129–145 "Factors Controlling the Structure of Sputtered Ta Films" which is cited in English text p. 2, lines 29–30.
R.O.C. Patent Publication No. 145634 w/translation, Nov. 1990.
Patent Abstracts of Japan, vol. 15, No. 108, (E–1045) 14 Mar., 1991 and JP–A–30 01 572 (Fujitsu Ltd), Jan. 8, 1991.
Dohjo et al, *Proceedings of the Society For Information Display*, vol. 29, No. 4, 1988, Los Angeles US, pp. 283–288.

Primary Examiner—Sara W. Crane
Assistant Examiner—Courtney A. Bowers
Attorney, Agent, or Firm—Nixon & Vanderhye, P.C.

[57] ABSTRACT

A semiconductor device includes an insulating substrate; and an electrode wiring provided on an area of the insulating substrate. The electrode wiring is formed of a material selected from the group consisting of an alloy of Ta and Nb, Nb, and a metal mainly including Nb. A method for producing a semiconductor device includes the steps of forming a layer including Nb doped with nitrogen on an insulating substrate by a sputtering method in an atmosphere of an inert gas including nitrogen, and then patterning the layer to form an electrode wiring on an area of the insulating substrate; and forming an oxide film at a portion of the electrode wiring by anodization, the portion including at least a surface thereof.

12 Claims, 10 Drawing Sheets

SEMICONDUCTOR DEVICE AND A METHOD FOR PRODUCING THE SAME

This is a Rule 62 File Wrapper Continuation of application Ser. No. 07/935,439, filed Aug. 26, 1992, now abandoned.

BACKGROUND OF THE INVENTION

1. Field of the Invention

The present invention relates to a semiconductor device such as a thin film transistor (hereinafter, referred to as TFT) which is used in, for example, a liquid crystal display device, and a method for producing the same.

2. Description of the Prior Art

A liquid crystal display device, which has features of being thin and consuming low power, has been a focus of attention as a novel device for replacing a CRT (cathode ray tube). Technological development has been especially active in the field of an active matrix liquid crystal display device including a TFT array, which has advantages such as high responding speed and high display quality. The target for further developments of this type of liquid crystal display devices includes reduction of the size of the display pixel to attain a higher precision, enlargement of the display area to realize a larger display screen, and improvement of the resistance against chemicals to facilitate the production process.

For achieving the above-mentioned specific developments, a gate electrode wiring and a source electrode wiring of a TFT, which are provided in the vicinity of a pixel electrode, are required to be made thinner and longer and to be highly resistant against the chemicals used in the production process. In the case when an active matrix substrate includes a reverse stagger TFT disposed on an insulating substrate, for example, Ta has conventionally been used for the gate electrode wiring to fulfill such requirements.

It is known that a thin Ta film has a crystalline structure of β-Ta and has an extremely high specific resistance of 170 to 200 $\mu\Omega\cdot$cm if it is formed by use of a conventional sputtering method or the like.

It is also known that a thin Ta film has a crystalline structure of α-Ta and has an extremely low specific resistance of 40 to 70 $\mu\Omega\cdot$cm if it is formed by use of sputtering in an Ar gas including a small amount of $N_2$. Accordingly, a thin film of α-Ta obtained in this manner has been used for an electrode wiring of a liquid crystal display device having a large display screen, for example, of approximately 10 inches. However, the thin film of α-Ta has a problem in that the specific resistance is unstable.

Japanese Laid-Open Patent Publication No. 62-205656 discloses a semiconductor device having an electrode wiring formed of an alloy of Mo and Ta. This electrode wiring also has a problem in that Mo is eluted when the electrode wiring is anodized, resulting in insufficient insulation of the anodized film.

A semiconductor including an electrode wiring which has a two-layer structure is also known. For example, Japanese Laid-Open Patent Publication No. 2-106723 discloses a TFT array including a two-layer electrode wiring which has a lower layer of Nb formed on an insulating substrate and an upper layer of Ta formed on the lower layer. Such an electrode wiring has a problem in that the lower layer can be etched too much to allow the upper layer to overhang the lower layer, thereby making the protection thereof by an insulating film difficult.

Thin Solid Films, 16, (1973) pp. 129–145 discloses a two-layer film including a lower layer, closer to a substrate, and an upper layer. When the lower layer is formed of Au, Pt, Rh, Be, W, α-Ta, Mo, $Si_3N_4$, or $Ta_2N$, the upper layer formed of Ta has a crystalline structure of α-Ta which is low in specific resistance. However, the lower layer as thick as 500 nm causes a problem in that, when such a two-layer film is applied to an electrode wiring, the electrode wiring cannot sufficiently be coated with a gate insulating film. As a result, a shortcircuit may occur between the gate electrode wiring and a source electrode wiring, or the gate electrode wiring may be disconnected. The above two-layer film has a further problem that the upper layer and the lower layer cannot be etched by an identical type of etchant.

SUMMARY OF THE INVENTION

The semiconductor device of the present invention includes an insulating substrate; and an electrode wiring provided on an area of the insulating substrate. The electrode wiring is formed of a material selected from the group consisting of an alloy of Ta and Nb, Nb, and a metal mainly including Nb.

Alternatively, the semiconductor device of the present invention includes an insulating substrate; and an electrode wiring provided on an area of the insulating substrate, the electrode wiring having a two-layer structure including a lower layer and an upper layer, the lower layer being closer to the insulating substrate than the upper layer. The lower layer is formed of an alloy of Ta and Nb, and the upper layer is formed of Ta.

Alternatively, the semiconductor device of the present invention includes an insulating substrate; a gate electrode wiring provided on an area of the insulating substrate; a gate insulating film provided on the surface of the insulating substrate having the gate electrode wiring; a semiconductor layer provided on a part of the gate insulating film, the part being above the gate electrode wiring; and a source electrode and a drain electrode both partially overlapping the semiconductor layer. The gate electrode wiring is formed of a material selected from the group consisting of an alloy of Ta and Nb, Nb, and a metal mainly including Nb.

Alternatively, the semiconductor device of the present invention includes an insulating substrate; a gate electrode wiring provided on an area of the insulating substrate, the gate electrode wiring having a two-layer structure including a lower layer and an upper layer, the lower layer being closer to the insulating substrate than the upper layer; a gate insulating film provided on the surface of the insulating substrate having the gate electrode wiring; a semiconductor layer provided on a part of the gate insulating film, the part being above the gate electrode wiring; and a source electrode and a drain electrode both partially overlapping the semiconductor layer. The lower layer is formed of an alloy of Ta and Nb, and the upper layer is formed of Ta.

Alternatively, the method for producing a semiconductor device of the present invention includes the steps of forming a layer including Nb doped with nitrogen on an insulating substrate by a sputtering method in an atmosphere of an inert gas including nitrogen, and then patterning the layer to form an electrode wiring on an area of the insulating substrate; and forming an oxide film at a portion of the electrode wiring by anodization, the portion including at least a surface thereof.

Alternatively, the method for producing a semiconductor device of the present invention includes the steps of forming a layer including Nb on an insulating substrate by a sputtering method at a deposition rate of 2 nm per second at the maximum, and then patterning the layer to form an electrode wiring on an area of the insulating substrate; and forming an oxide film at a portion of the electrode wiring by anodization, the portion including at least a surface thereof.

Alternatively, the method for producing a semiconductor device of the present invention includes the steps of forming a layer including Nb on an insulating substrate by a sputtering method, and then patterning the layer to form an electrode wiring on an area of the insulating substrate; and forming an oxide film at a portion of the electrode wiring by anodization, the portion including at least a surface thereof. The anodization is stopped, in the state where a formation voltage is obtained, before the changing rate per time unit of the resistance of the oxide film, expressed by $dR/dt=(V/I^2)\cdot(-dI/dt)$, reaches less than $7.0\times10^3$ $\Omega\cdot cm^2/sec$, where R indicates the resistance of the oxide film ($\Omega\cdot cm^2$), t indicates the time (sec), V indicates the formation voltage (V), I indicates the current density (A/cm$^2$), and dI/dt indicates the changing ratio of the current density per time unit.

Alternatively, the method for producing a semiconductor device of the present invention includes the steps of forming a first layer including Nb on an insulating substrate by a sputtering method, and then patterning the first layer to form a first wiring layer on an area of the insulating substrate; forming a second layer including Nb doped with nitrogen on the insulating substrate having the first wiring layer by a sputtering method in an atmosphere of an inert gas including nitrogen, and then patterning the second layer to form a second wiring layer on the first wiring layer, thereby forming an electrode wiring having a two-layer structure on the area of the insulating substrate; and forming an oxide film at a portion of the electrode wiring by anodization, the portion including at least a surface thereof.

Alternatively, the method for producing a semiconductor device of the present invention includes the steps of forming a first layer including Nb on an insulating substrate by a sputtering method, and then patterning the first layer to form a first wiring layer on an area of the insulating substrate; forming a second layer including Nb on the insulating substrate having the first wiring layer by a sputtering method at a deposition rate of 2 nm per second at the maximum, and then patterning the second layer to form a second wiring layer on the first wiring layer, thereby forming an electrode wiring having a two-layer structure on the area of the insulating substrate; and forming an oxide film at a portion of the electrode wiring by anodization, the portion including at least a surface thereof.

Alternatively, the method for producing a semiconductor device of the present invention includes the steps of forming a first layer including Nb on an insulating substrate by a sputtering method, and then patterning the first layer to form a first wiring layer on an area of the insulating substrate; forming a second layer including Nb on the insulating substrate having the first wiring layer by a sputtering method, and then patterning the second layer to form a second wiring layer on the first wiring layer, thereby forming an electrode wiring having a two-layer structure on the area of the insulating substrate; and forming an oxide film at a portion of the electrode wiring by anodization, the portion including at least a surface thereof. The anodization is stopped, in the state where a formation voltage is obtained, before the changing rate per time unit of the resistance of the oxide film, expressed by $dR/dr=(V/I^2)\cdot(-dI/dt)$, reaches less than $7.0\times10^3$ $\Omega\cdot cm^2/sec$, where R indicates the resistance of the oxide film ($\Omega\cdot cm^2$), t indicates the time (sec), V indicates the formation voltage (V), I indicates the current density (A/cm$^2$), and dI/dt indicates the changing ratio of the current density per time unit.

Thus, the invention described herein makes possible the advantages of providing (1) a semiconductor device which includes an electrode wiring formed of a material having a low and stable specific resistance, and a method for producing the same, (2) a semiconductor device which includes an electrode wiring formed of a material having a high chemical resistance, and a method for producing the same, and (3) a semiconductor device which includes an electrode wiring formed of a material which offers a highly insulating anodized film, and a method for producing the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the accompanying drawings.

EXAMPLE 1

Figure 1:
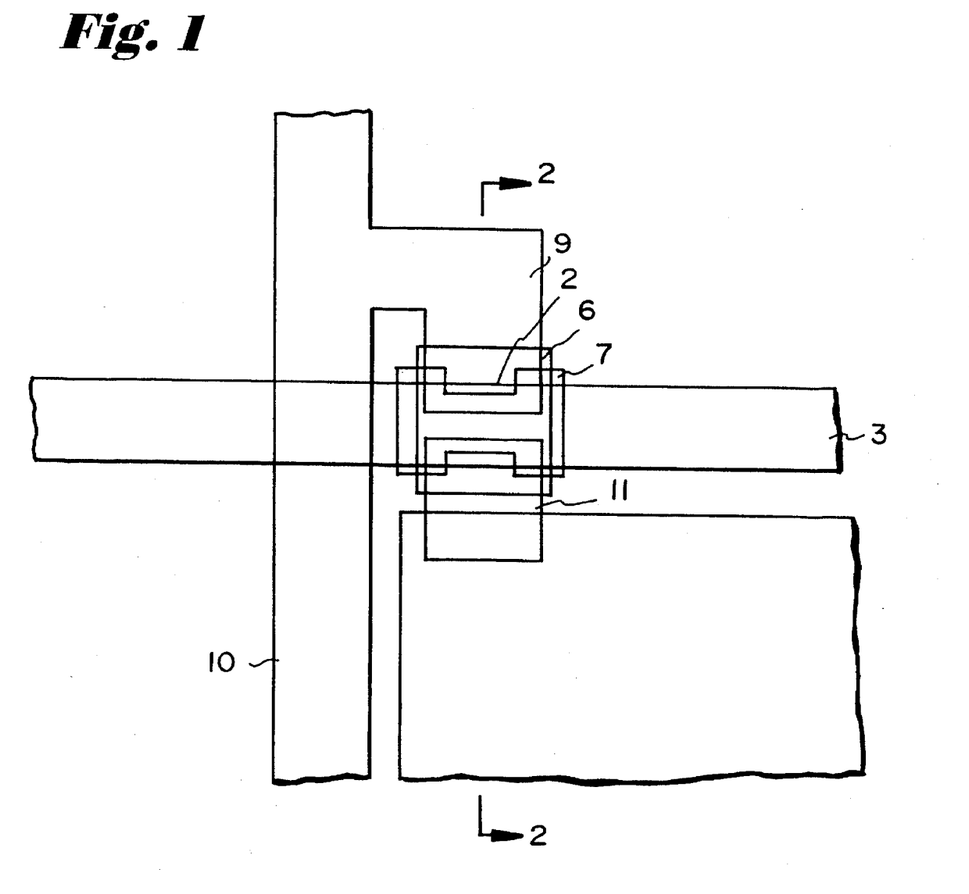
FIG. 1 is a plan view of a TFT according to a first example of the present invention.
Figure 2:
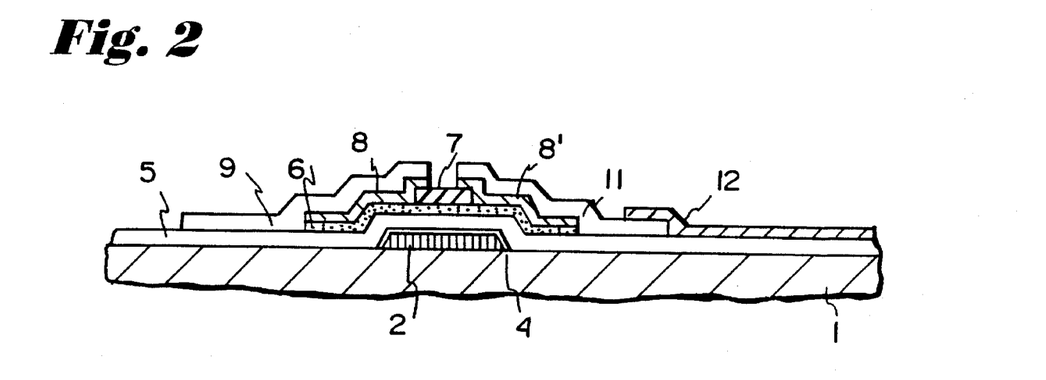
FIG. 2 is a cross sectional view taken along lines A—A of FIG. 1.

FIG. 1 is a plan view of a TFT according to a first example of the present invention, and FIG. 2 is a cross sectional view taken along the lines A—A of FIG. 1.

As is shown in FIGS. 1 and 2, the TFT includes a gate electrode 2 as a portion of a gate electrode wiring 3 provided in a thickness of 200 to 400 nm on an insulating substrate 1. The gate electrode wiring 3 including the gate electrode 2 is formed of an alloy of Ta and Nb by use of, for example, a sputtering method. On the gate electrode wiring 3, an insulating anodized film 4 is formed by anodizing a surface of the gate electrode wiring 3. The anodization is performed using a formation solution such as aqueous ammonium tartrate, aqueous ammonium borate, or aqueous ammonium phosphate.

Then, a gate insulating film 5 is provided in a thickness of 300 to 400 nm so as to cover the whole surface of the insulating substrate 1 having the anodized film 4. The gate insulating film 5 is formed of, for example, $SiN_x$ (X=0.5 to 1.5) by use of a sputtering method or a CVD (chemical vapor deposition) method. The gate insulating film 5 and the anodized film 4 constitute a two-layer insulating structure of the TFT of the first example. The gate insulating film 5 may be formed of $SiO_2$, SiON or the like instead of $SiN_x$.

On a part of the gate insulating film 5 above the gate electrode 2 and a vicinity thereof, a semiconductor layer 6 is provided in a thickness of 20 to 60 nm. The semiconductor layer 6 is formed of a non-doped a-Si semiconductor by use of a CVD method and etching. On both ends of the semiconductor layer 6, contact layers 8 and 8' are provided each in a thickness of approximately 40 nm. The contact layers 8 and 8' are formed of a phosphorus-doped a-Si (n+a-Si) semiconductor by use of a CVD method and etching. On a part of the semiconductor layer 6 above the gate electrode 2, an etching stop layer 7 may be formed of $SiN_x$ so as to be partially overlapped by the contact layers 8 and 8'. The etching stop layer 7 protects the semiconductor layer 6 from the etchant used for the formation of the contact layers 8 and 8'.

Further, a source electrode 9 and a drain electrode 11 are each provided in a thickness of 200 to 300 nm so as to cover the contact layers 8 and 8'. The source electrode 9 constitutes an extended portion of the source electrode wiring 10. The source electrode wiring 10 including the source electrode 9 is formed of a material such as Mo, Ti or Cr by a sputtering method. The drain electrode 11 is formed in the same manner.

In the TFT according to the first example, the gate electrode wiring 3 including the gate electrode 2 is formed of the alloy of Ta and Nb having a stable body-centered cubic structure. In more detail, Nb exists only in a body-centered cubic lattice and is uniformly dissolved in Ta. Accordingly, Ta also has a stable body-centered cubic structure, namely, an α phase. As a result, the gate electrode wiring 3 has a low and stable specific resistance of approximately 40 μΩ·cm.

Table 1 shows the resistance of Nb, Ta and Al against chemicals which can be used as an etchant. The values indicate the etching rate per minute.

TABLE 1

| Etchant | Nb | Ta | Al |
|---|---|---|---|
| BHF(20° C.) | — | — | 10 nm/min |
| HBr(40° C.) | — | — | 30 nm/min |
| 1:2 HCl + FeCl$_3$(40° C.) | — | — | 2000 nm/min |
| 4:1 H$_3$PO$_4$ + HNO$_3$(30° C.) | — | — | 250 nm/min |
| NaOH(40° C.) | — | — | 250 nm/min |
| 1:20 HF + HNO$_3$(20° C.) | 1000 nm/min | 250 nm/min | 150 nm/min |

"—" indicates no etching occurred.

As is understood from Table 1, Nb and Ta are both etched only by a mixed solution of hydrofluoric acid and nitric acid but not by any other etchant. Therefore, an alloy of Ta and Nb should also be etched only by a mixed solution of hydrofluoric acid and nitric acid. Accordingly, after the gate electrode wiring 3 is formed, various etchants can be used in the subsequent steps for producing a TFT structure. Thus, a semiconductor device having a gate electrode wiring formed of an alloy of Ta and Nb shows an excellent processability.

In the TFT of the first example, since the insulating layer has a two-layer structure consisting of the anodized film 4 and the gate insulating film 5, current leakage is effectively prevented, thereby reducing generation of defective products and increasing the production yield.

EXAMPLE 2

Figure 3:
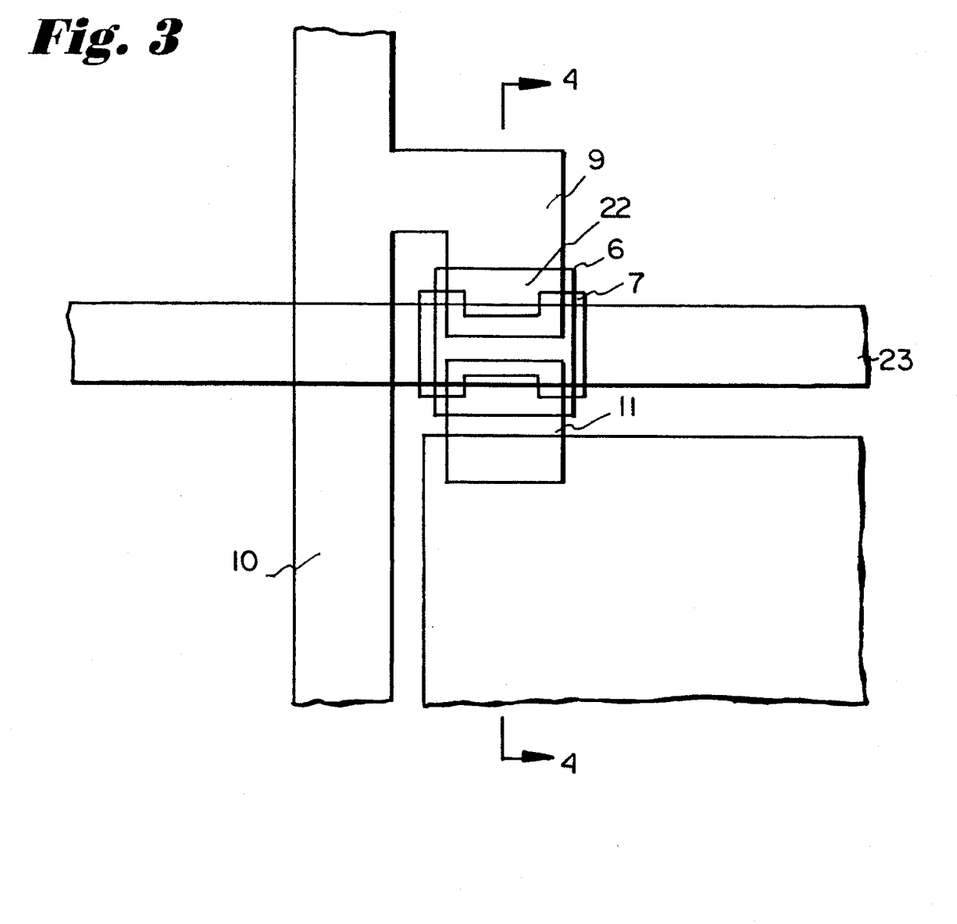
FIG. 3 is a plan view of a TFT according to a second example of the present invention.
Figure 4:
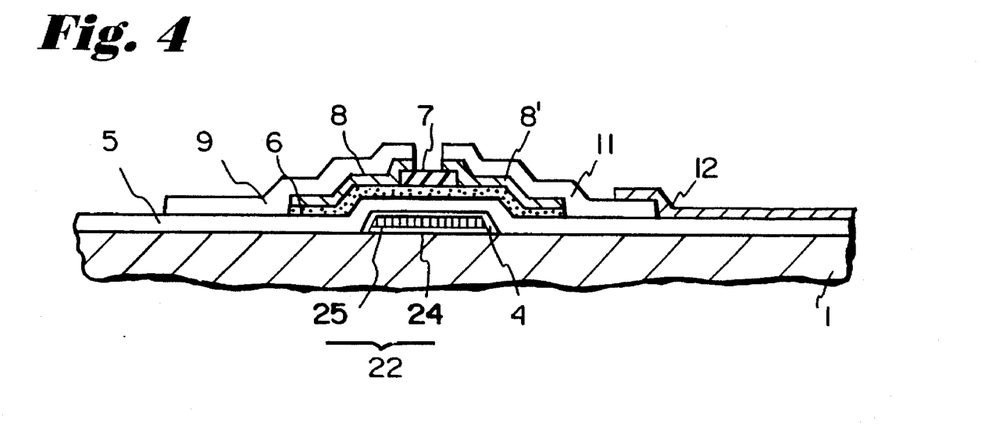
FIG. 4 is a cross sectional view taken along lines B—B of FIG. 3.

FIG. 3 is a plan view of a TFT according to a second example of the present invention, and FIG. 4 is a cross sectional view taken along the lines B—B of FIG. 3.

The TFT of the second example according to the present invention is distinct from that of the first example only in that a gate electrode 22 as a portion of a gate electrode wiring 23 is provided instead of the gate electrode 2 as a portion of the gate electrode wiring 3. The gate electrode wiring 23 including the gate electrode 22 has a two-layer structure of an alloy layer 24 of Ta and Nb as a lower layer and a Ta layer 25 as an upper layer. The alloy layer 24 is formed in a thickness of several to 20 nm on the insulating substrate 1 by use of, for example, a sputtering method and etching. The Ta layer 25 is formed in a thickness of approximately 300 nm in a similar manner.

In the case when the gate electrode wiring is formed only of a one-layer structure of an alloy of Ta and Nb as in the first example, Ta and Nb act as an impurity to each other. As a result, the specific resistance of the gate electrode wiring 3 in the first example is approximately 40 μΩ·cm at the lowest. In the case when the gate electrode wiring has a two-layer structure as in the second example, the Ta layer 25 is influenced by the alloy layer 24 which has a body-centered cubic structure. Thus, the Ta layer 25 also has a body-centered cubic structure, namely, an α phase. As a result, the gate electrode wiring 23 obtains an extremely low specific resistance of approximately 20 μΩ·cm.

As is apparent from Table 1, the alloy layer 24 of Ta and Nb has a chemical resistance almost as high as that of the Ta layer 25. Thus, the alloy layer 24 is hardly etched more than the Ta layer 25 so that the Ta layer 25 will not overhang the alloy layer 24. In addition, since the alloy layer 24 is as thin as several to 20 nm, the gate electrode wiring 23 including the alloy layer 24 can be made thinner than a two-layer electrode wiring known in the prior art. Therefore, the gate electrode wiring 23 of the two-layer structure can efficiently be covered by a protecting layer such as the gate insulating film 5.

Moreover, owing to good adherence between the alloy layer 24 and the Ta layer 25, a microscopic processing for higher precision is possible even with the two-layer structure.

Since the insulating anodized film 4 is formed on the gate electrode wiring 23, the anodized film 4 and the gate insulating film 5 provided thereon constitute a two-layer insulating structure. Accordingly, generation of defective products due to current leakage is effectively prevented, thereby increasing the production yield.

EXAMPLE 3

A TFT of a third example according to the present invention is distinct from that of the first example in that a gate electrode wiring 3 including a gate electrode 2 is formed of Nb. Since the TFT of the third example is identical with that of the first example in construction, the identical reference numerals with those in FIGS. 1 and 2 will be used.

The gate electrode wiring 3 formed of Nb by use of a sputtering method has the characteristics shown in FIGS. 5 through 8.

Figure 5:
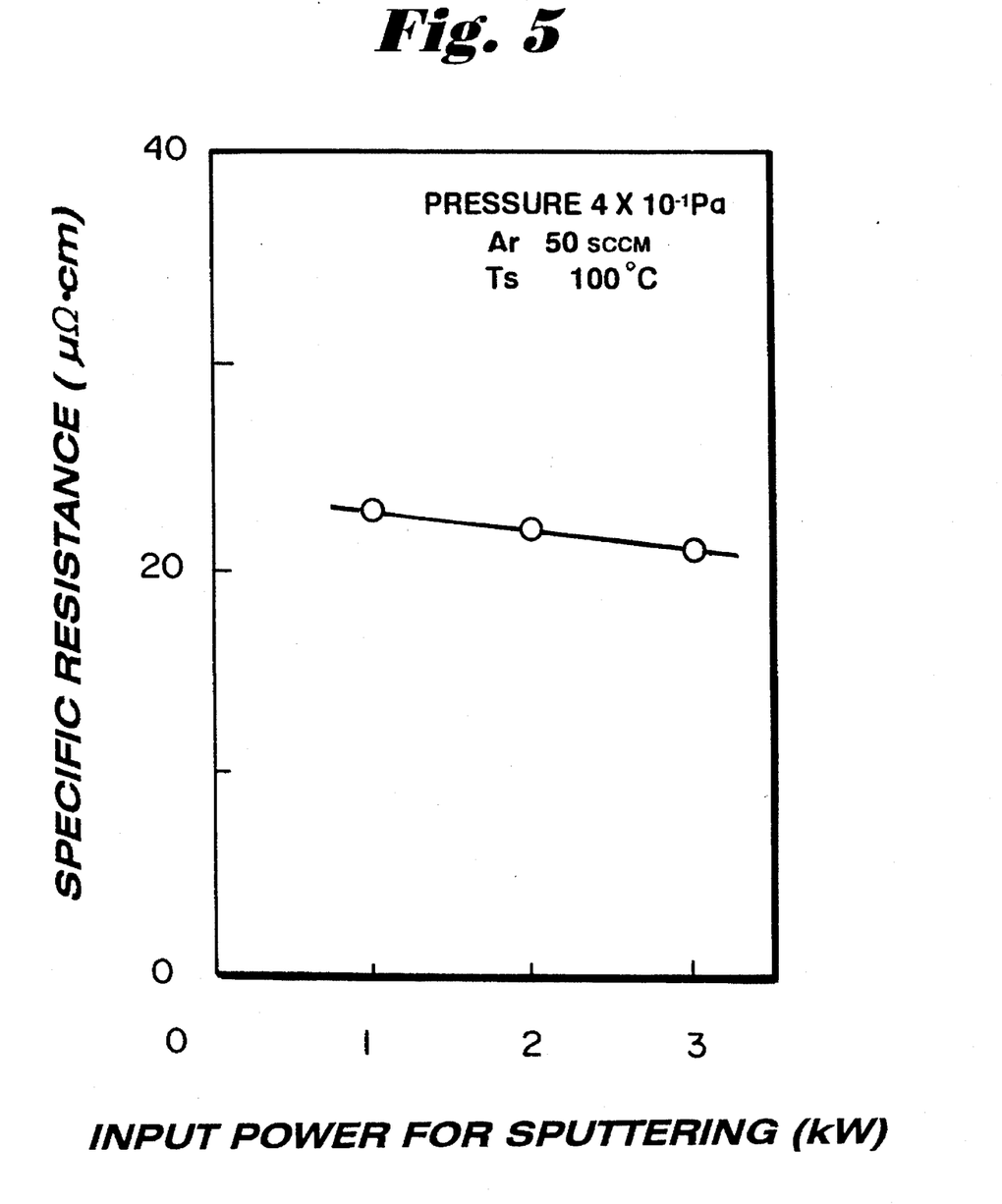
FIG. 5 is a graph illustrating the relationship in a third example of the present invention between the input power (kW) for sputtering Nb in order to form gate electrode wirings and the specific resistance ($\mu\Omega\cdot cm$) of the obtained gate electrode wirings.
Figure 6:
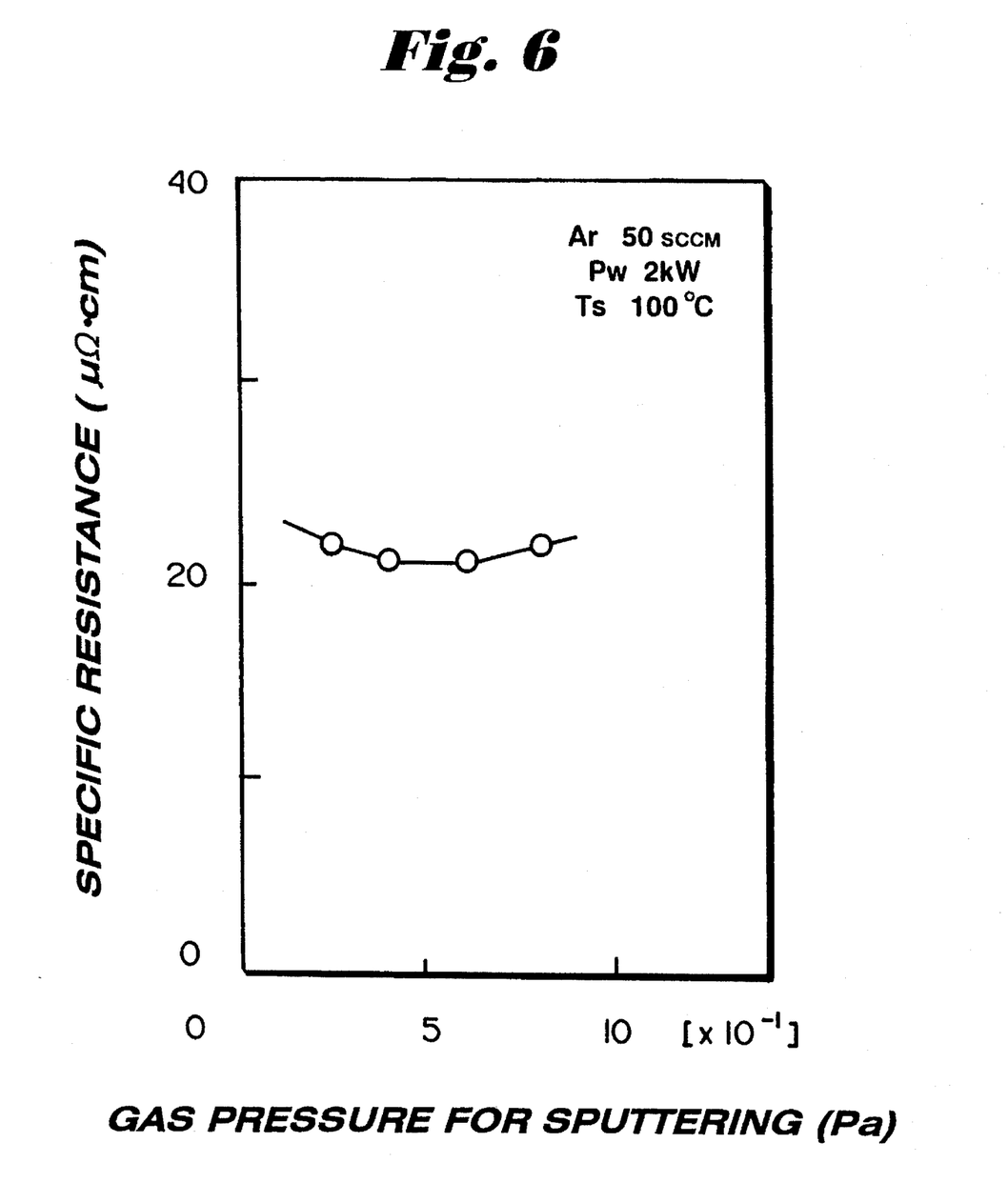
FIG. 6 is a graph illustrating the relationship in the third example of the present invention between the gas pressure (Pa) for sputtering Nb in order to form gate electrode wirings and the specific resistance ($\mu\Omega\cdot cm$) of the obtained gate electrode wirings.
Figure 7:
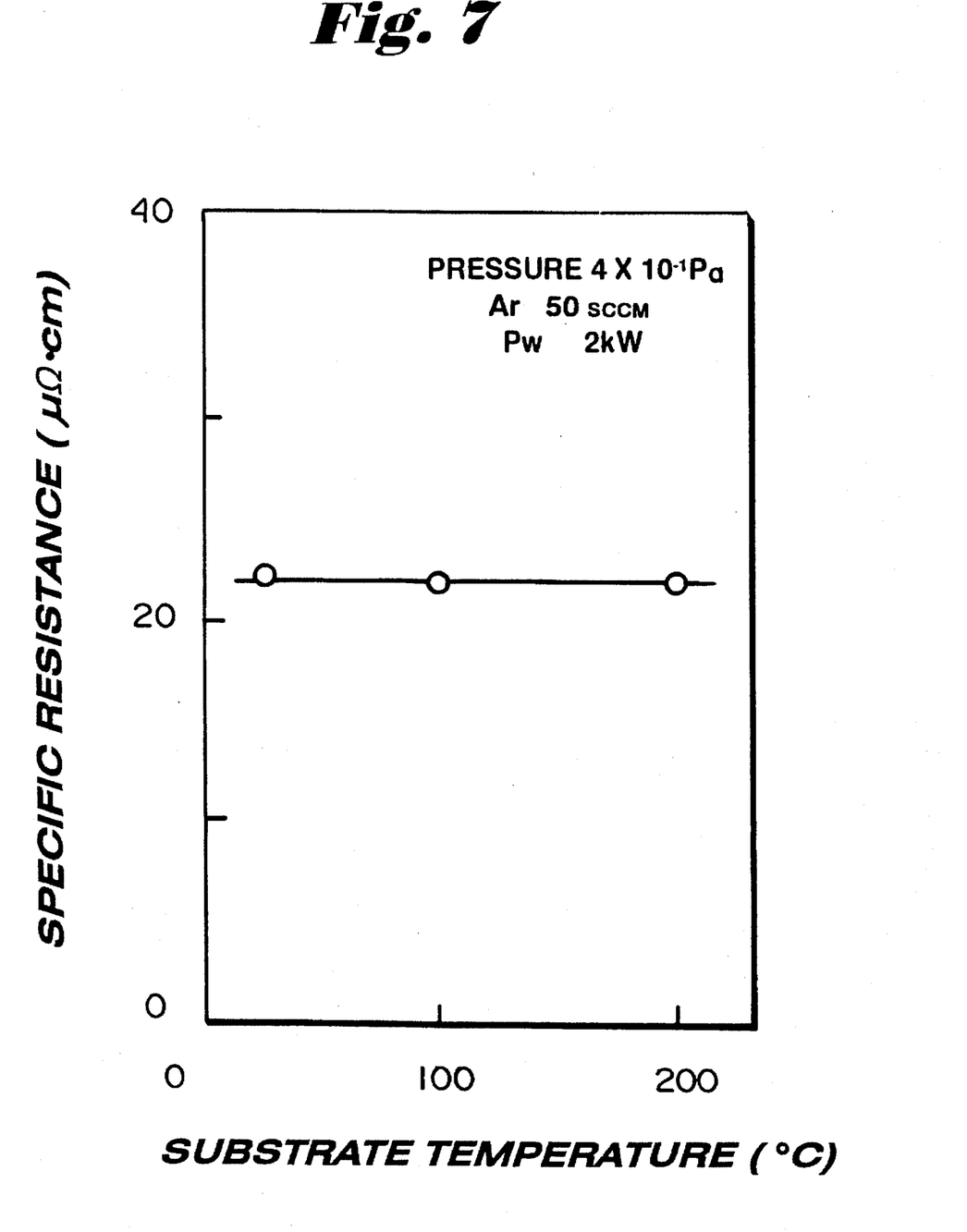
FIG. 7 is a graph illustrating the relationship in the third example of the present invention between the substrate temperature (°C.) for sputtering Nb in order to form gate electrode wirings and the specific resistance ($\mu\Omega\cdot cm$) of the obtained gate electrode wirings.
Figure 8:
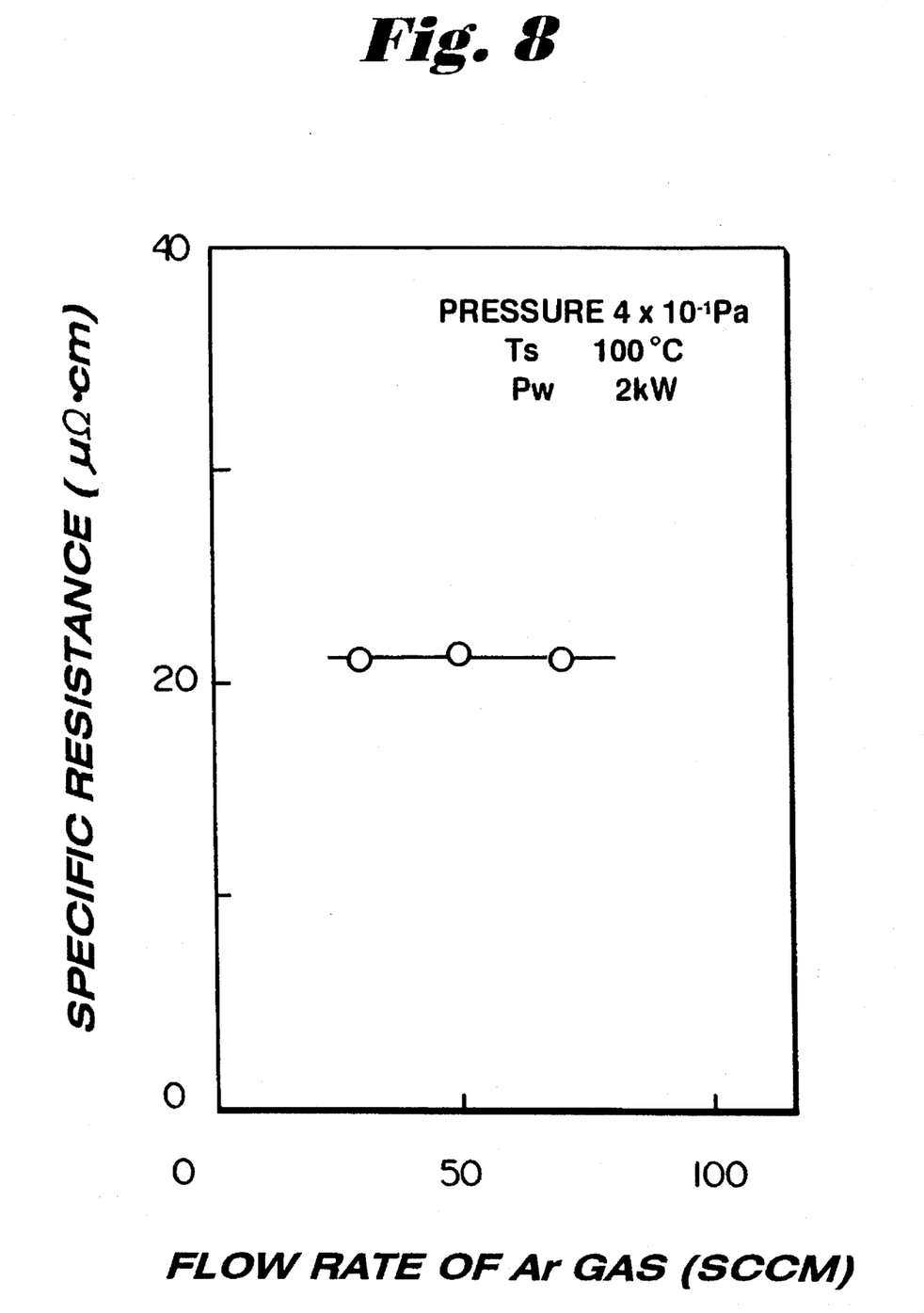
FIG. 8 is a graph illustrating the relationship in the third example of the present invention between the flow rate (SCCM) of Ar gas for sputtering Nb in order to form gate electrode wirings and the specific resistance ($\mu\Omega\cdot cm$) of the obtained gate electrode wirings.

FIGS. 5 through 8 respectively illustrate the relationships of the specific resistance ($\mu\Omega\cdot cm$) of the gate electrode wiring 3 with the input power (kW) for sputtering (FIG. 5), with the gas pressure (Pa) for sputtering (FIG. 6), with the substrate temperature (° C.) (FIG. 7), and with the flow rate (SCCM) of Ar gas used for sputtering (FIG. 8). As is shown in FIG. 5, the specific resistance of the gate electrode wiring 3 formed of Nb is slightly increased when the input power is decreased. However, the specific resistance is generally stable and is in the range of as low as 20 to 25 $\mu\Omega\cdot cm$ in all the cases.

As is apparent from Table 1, Nb is only etched by a mixed solution of hydrofluoric acid and nitric acid but not by any other etchant. Thus, the electrode wiring of Nb in the third example has a high chemical resistance, resulting in an excellent process-ability of a semiconductor device including such a gate electrode wiring.

Nb is also advantageous as a material for an electrode wiring in that hillock or migration such as occurs in Al is hardly generated.

Moreover, in the case when a dry etching method is employed, Nb can be etched by $CF_4$ and $O_2$.

The gate electrode wiring 3 formed of Nb may be anodized by use of a formation solution such as aqueous ammonium tartrate, aqueous ammonium borate or aqueous ammonium phosphate.

Although the gate electrode wiring 3 is formed of Nb in the third example, the same effects can be obtained with a metal mainly including Nb. The metal mainly including Nb is preferably Nb doped with nitrogen.

As is apparent from the third example, the gate electrode wiring formed of Nb has a low and stable specific resistance. Nb has another advantage that no hillock or migration is generated.

Brief Explanation of Examples 4 and 5

It is known that Nb having a body-centered cubic structure, when being oxidized, usually gives an amorphous niobium oxide. However, during anodization of the gate electrode wiring of Nb performed under a conventional condition tends to generate microscopic crystals even at the formation voltage of only 100 V. The anodized Nb film obtained in this manner develops a defect portion at an interface between a microscopic crystal and the amorphous portion. The defective portion allows a leak current to flow, which generates Joule heat and thus deteriorates the anodized film. The deterioration of the anodized film increases the leak current, thereby easily causing dielectric breakdown. Accordingly, in order to avoid dielectric breakdown, the anodized Nb film cannot be made thick. For this reason, Nb has conventionally been unpractical as a material for a gate electrode wiring.

Fourth and fifth examples of the present invention provide a method for anodization in which dielectric breakdown can be avoided. The anodization is performed on a surface of an electrode wiring formed of Nb on an insulating substrate without unnecessarily applying a high voltage for a long period of time. For this purpose, the anodization is stopped when the formation of the Nb anodic oxide film is almost completed. Practically, the anodization is stopped before the changing rate of the resistance per time unit of the electrode wiring, expressed by $dR/dr=(V/I^2)\cdot(-dI/dt)$, reaches less than a specific value, preferably less than $7.0\times 10^3$ $\Omega\cdot cm^2/sec$, in the state where a formation voltage is obtained. In this way, dielectric breakdown of the anodized film can be prevented while forming the anodized film having a sufficient thickness.

In order to perform the anodization in the above manner, an electrode wiring is formed preferably by using at least any one of the following four methods. In all the four methods, deposition of Nb is performed by use of a sputtering method.

[Method 1]

Nb is deposited in an inert gas atmosphere to form a first Nb layer, and then the Nb layer is patterned to obtain a first electrode wiring layer of Nb. Next, Nb is deposited on the first electrode wiring layer in an atmosphere of an inert gas including nitrogen to form a second Nb layer, and then the second Nb layer is patterned to obtain a second electrode wiring layer of Nb doped with nitrogen.

[Method 2]

Nb is deposited in an atmosphere of an inert gas including nitrogen to form a Nb layer, and the Nb layer is patterned to obtain an electrode wiring of Nb doped with nitrogen.

[Method 3]

Nb is deposited in an inert gas atmosphere to form a Nb layer, and then the Nb layer is patterned to obtain a first electrode wiring layer of Nb. Next, Nb is deposited on the first electrode wiring layer in an inert gas atmosphere at a deposition rate of 2 nm/sec or less to form a second Nb layer, and then the second Nb layer is patterned to obtain a second electrode wiring layer of Nb.

[Method 4]

Nb is deposited in an inert gas atmosphere at a deposition rate of 2 nm/sec or less to form a Nb layer, and the Nb layer is patterned to obtain an electrode wiring of Nb.

In Methods 1 and 2, the inert gas including nitrogen is prepared with the ratio of flow rate of nitrogen with respect to that of the gas other than nitrogen is preferably 0.08 to 0.3.

By employing any one of Methods 1 through 4, the crystallinity of Nb is reduced in a portion of the electrode wiring which will be anodized afterward. The low crystallinity of Nb restricts the generation of microscopic crystals in the resultant anodized film, thereby reducing the generation of leak current. Accordingly, dielectric breakdown of the anodized film can be prevented even at a formation voltage of 100 V or higher. This allows the formation of the anodized film having a sufficient thickness. It is also possible to combine the conditions of two or more methods among Methods 1 through 4, thereby further restricting the generation of microscopic crystals in the anodizable portion of the electrode wiring.

After the anodization, the electrode wiring may be heat-treated. This heat treatment is performed preferably at a temperature in the range of 150° to 250° C. for 60 to 120 minutes. Such a heating process reduces moisture in the anodized film, resulting in higher insulation of the anodized film.

EXAMPLE 4

The fourth example according to the present invention concerns a TFT having an electrode wiring of Nb doped with nitrogen. Except for this point, the TFT of the fourth example has the same construction as that of the TFT of the third example. This electrode wiring was produced in the following manner.

First, a Nb layer was formed on the insulating substrate 1 by use of a DC magnetron sputtering device under the conditions of a pressure of $4.0 \times 10^{-1}$ Pa, an input power of 1 kW, a flow rate of Ar gas of 50 SCCM, a flow rate of $N_2$ gas of 10 SCCM, a substrate temperature of 200° C., and a deposition rate of 1.8 nm/sec. Next, the Nb layer was patterned to obtain an electrode wiring formed of Nb doped with nitrogen.

Then, the electrode wiring was anodized by use of a 1% solution of ammonium tartrate in a 2:1 mixture of water and ethylene glycol as a formation solution, and under the conditions of an initial current density of $2.0 \times 10^{-4}$ A/cm$^2$ and a formation period of 60 minutes after a formation voltage is obtained. The anodic oxidation was stopped at the point where the formation voltage V=160 (V), the current density I=$7.0 \times 10^{-6}$ (A/cm$^2$), the changing rate per time unit of the current density dI/dt=$-2.3 \times 10^{-9}$ (A/cm$^2$·sec). From these values, the changing rate of resistance per time unit dR/dt=$7.5 \times 10^3$ ($\Omega$·cm$^2$/sec). Ethylene glycol was included in the formation solution in order to prevent the occurrence of microscopic discharge in the formation solution during the anodization.

Figure 9:
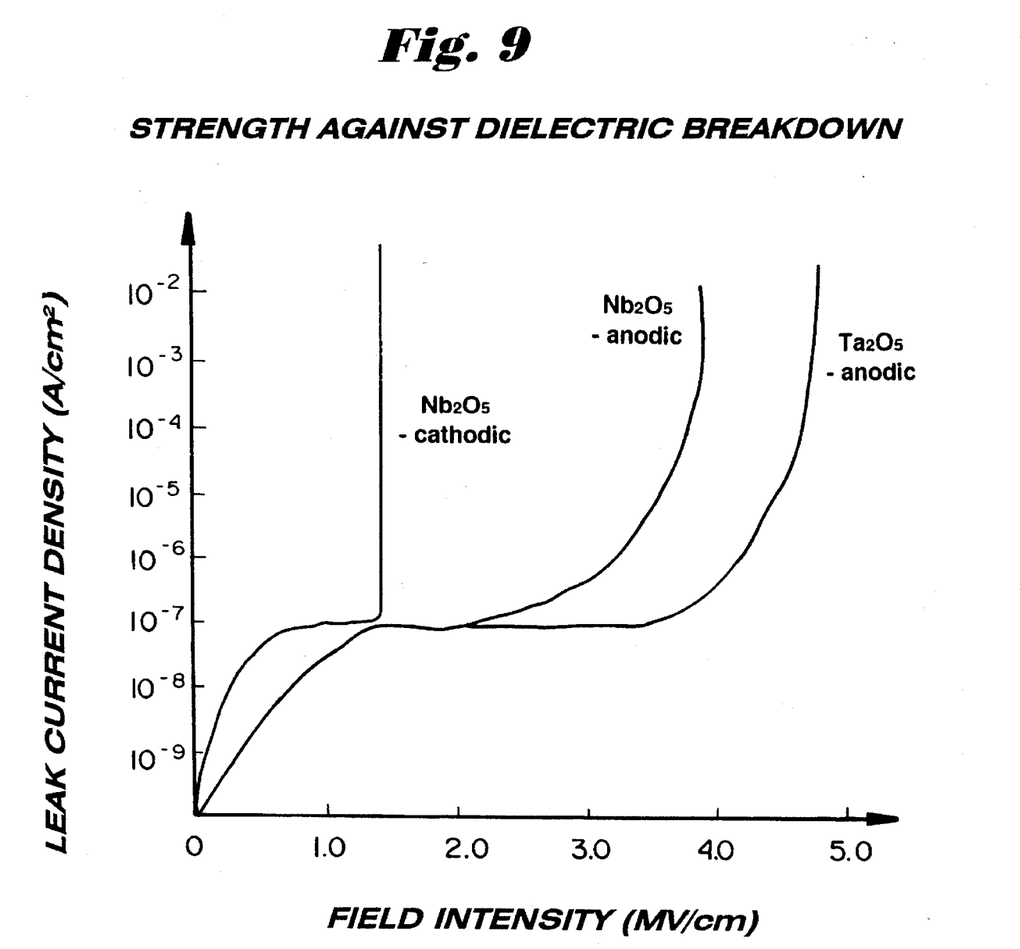
FIG. 9 is a graph illustrating the strength against dielectric breakdown of an anodized Nb film according to a fourth example of the present invention and a conventional anodized film of Ta.

FIG. 9 shows the relationship between the field intensity (MV/cm) and the leak current density (A/cm$^2$) of the anodized film of Nb obtained in the above manner, and that of the conventional anodized film of Ta. As is shown in FIG. 9, the field intensity at which the dielectric breakdown of the anodized Nb film occurs is 3.25 MV/cm when the anodized film is used as an anode, and 1.5 MV/cm when the anodized film is used as a cathode. These values mean that the anodized Nb film has a withstand voltage as high as that of the conventional anodized Ta film. The leak current density of the anodized Nb film was $10^{-7}$ A/cm$^2$ at 80 V. As is apparent from these results, the anodized Nb film obtained in the fourth example has a low leak current and high resistance against dielectric breakdown.

For comparison, another electrode wiring for a TFT was produced in the following manner.

First, a Nb layer was formed on the insulating substrate 1 by use of a DC magnetron sputtering device under the conditions of a pressure of $4.0 \times 10^{-1}$ Pa, an input power of 3 kW, a flow rate cf Ar gas of 50 SCCM, a substrate temperature of 200° C., and a deposition rate of 5.2 nm/sec. Next, the Nb layer was patterned to obtain an electrode wiring formed of Nb.

Then, the electrode wiring was anodized by use of a 1% solution of ammonium tartrate in a 2:1 mixture of water and ethylene glycol as a formation solution, and under the conditions of an initial current density of $4.0 \times 10^{-4}$ A/cm$^2$ and a formation voltage of 160 V.

Figure 10:
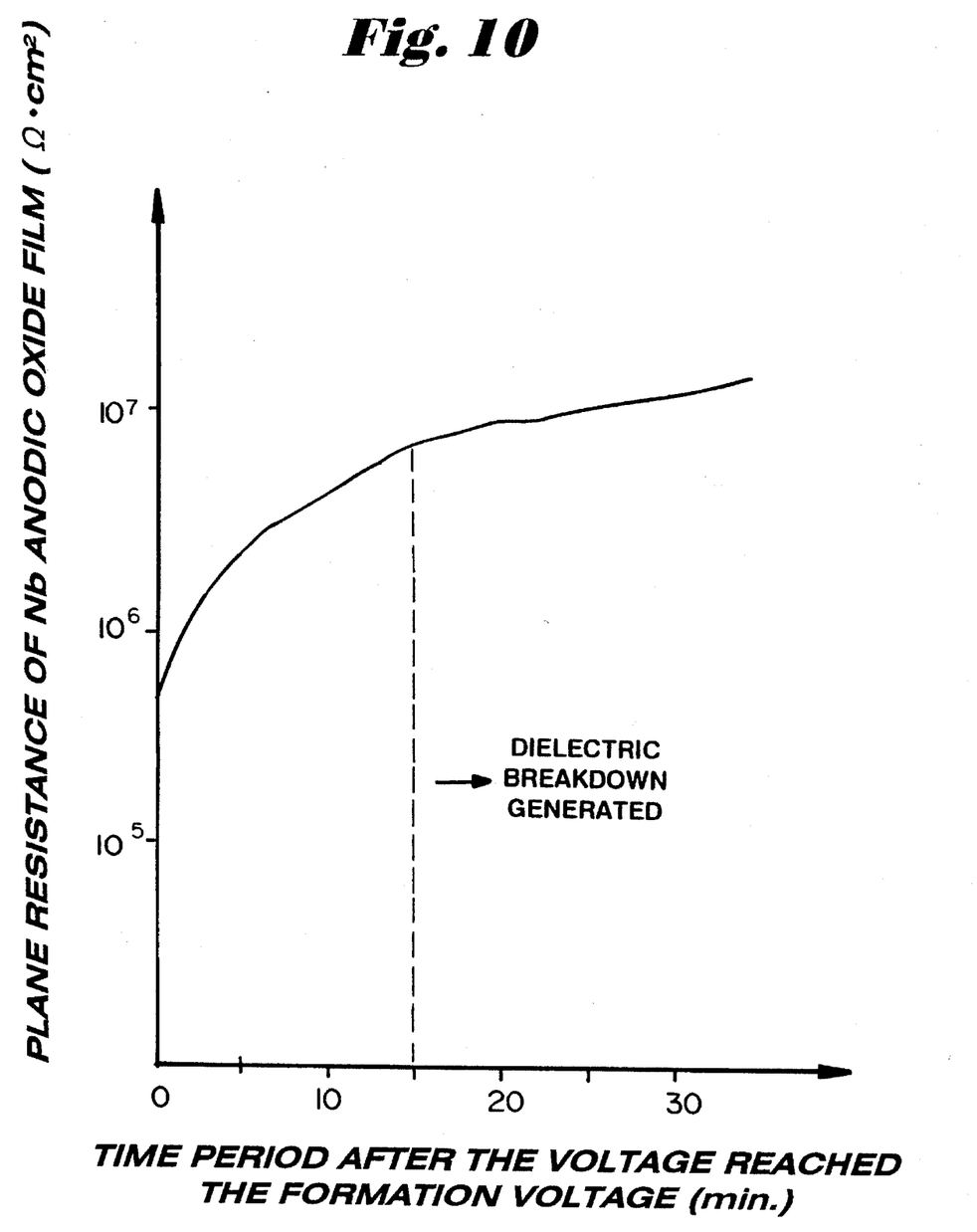
FIG. 10 is a graph illustrating the relationship in the fourth example of the present invention between the time period after a formation voltage is obtained and a plane resistance of an anodized Nb film which is formed as a comparative example.

FIG. 10 shows the relationship between the time period after a formation voltage is obtained and plane resistance of the Nb anodic oxide film. As can be seen from FIG. 10, the dielectric breakdown of the anodized Nb film started generating 15 minutes after the formation voltage was obtained. At this point, the changing rate per time unit of the Nb anodic oxide film was $7.0 \times 10^3$ $\Omega$·cm$^2$/sec.

EXAMPLE 5

Figure 11:
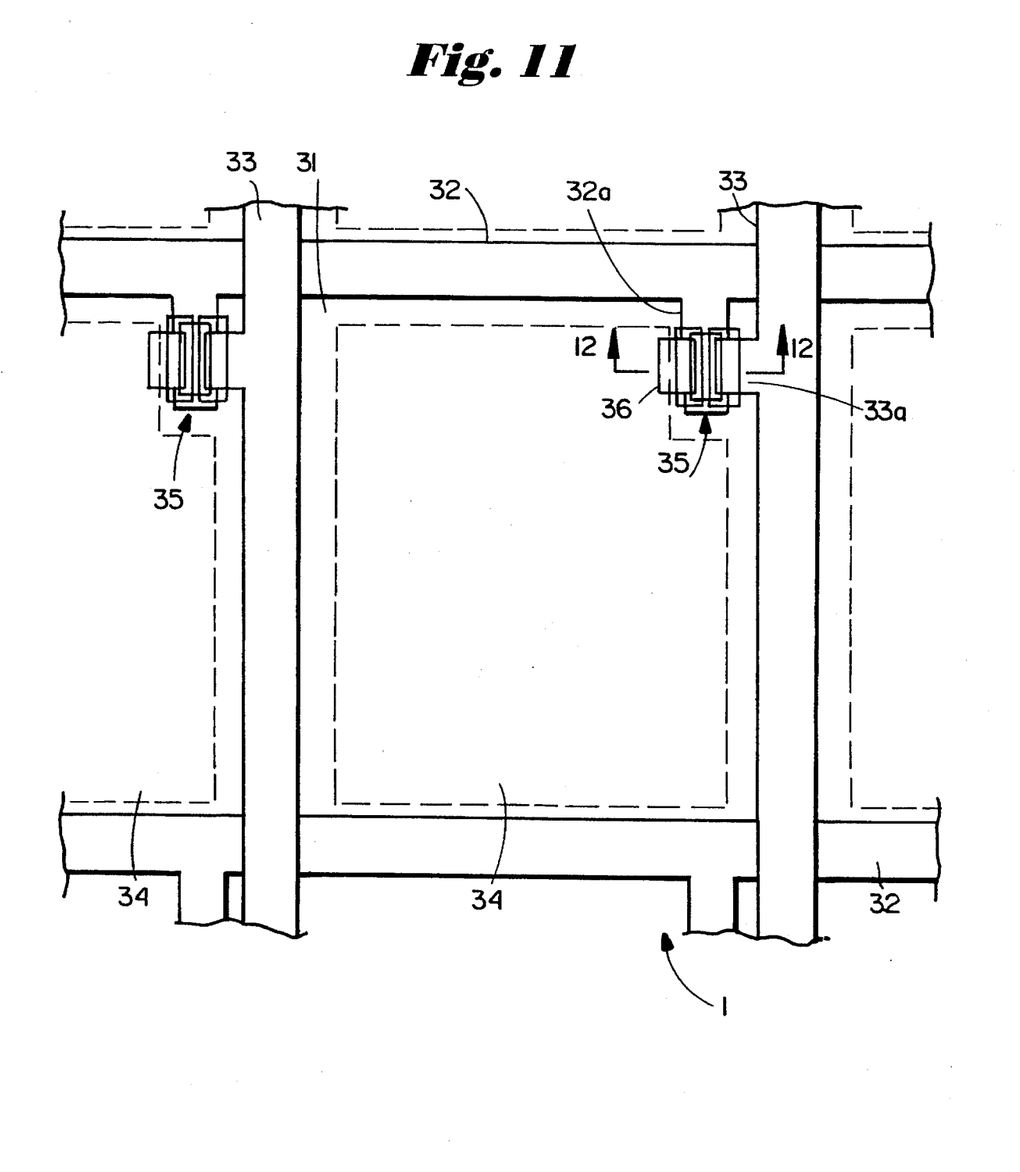
FIG. 11 is a plan view of an active matrix substrate having a TFT array according to a fifth example of the present invention.

FIG. 11 shows an active matrix substrate using a TFT array according to the fifth example of the present invention. As is shown in FIG. 11, the active matrix substrate includes a plurality of gate electrode wirings 32 and a plurality of source electrode wirings 33 crossing the gate electrode wirings 32. Both of the wirings 32 and 33 are provided on an insulating glass plate 31. Areas defined by the gate electrode wirings 32 and the source electrode wirings 33 each have a pixel electrode 34. Each pixel electrode 34 is electrically connected to a TFT 35 provided at a corner thereof. Each TFT 35 includes a gate electrode 32a projecting toward the pixel electrode 34 from the gate electrode wiring 32, a source electrode 33a projecting toward the pixel electrode 34 from the source electrode wiring 33, and a drain electrode 36.

A method for producing the active matrix substrate having the above construction will be described with reference to FIGS. 12a through 12i, which would be cross sectional views taken along lines C—C of FIG. 11.

Figure 12A:
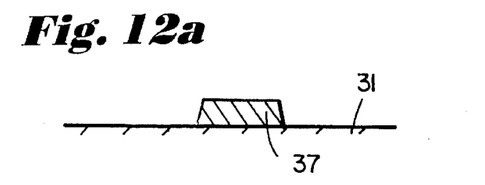
FIGS. 12a through 12i are cross sectional views illustrating production stages of the active matrix substrate of the fifth example which would be taken along lines C—C of FIG. 11.

On the glass insulating plate 31, a Nb layer 37 is formed in a thickness of 100 to 200 nm by use of a sputtering method in an inert gas atmosphere. Next, a resist film is formed in a pattern of the gate electrode wiring 32 on the Nb layer 37 by use of a lithographic method, and a portion of the Nb layer 37 which is not covered with the resist film is etched to shape the Nb layer 37, as is shown in FIG. 12a, into the pattern of the gate electrode wiring 32 including the gate electrode 32a.

Figure 12B:
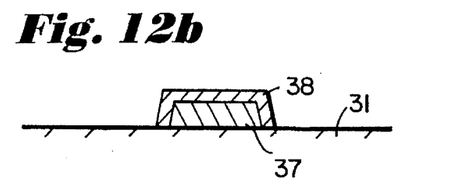

On the glass insulating plate 31 having the above-patterned Nb layer 37, another Nb layer 38 doped with nitrogen is formed by use of a sputtering method in an atmosphere of an inert gas including nitrogen. The thickness of the Nb layer 38 is preferably 50 to 200 nm. The sputtering is performed with an input power of 1 kW. The ratio of flow rate of $N_2$ gas with respect to that of Ar gas is preferably 0.08 to 0.3, and in this case, 0.16. The deposition rate is preferably 2 nm/sec or less, and in this case, 2 nm/sec. Then, a resist film is formed on the Nb layer 38 in a pattern of the gate electrode wiring 32 by use of a lithographic method, and a portion of the Nb layer 38 which is not covered with the resist film is etched to shape the Nb layer 38, as is shown in FIG. 12b, into the pattern of the gate electrode wiring 32 including the gate electrode 32a.

Next, the anodization of the nitrogen-doped Nb layer 38 is performed using a formation solution of a 3% solution of ammonium tartrate under the conditions of a formation voltage of 100 to 180 V and an initial current density of 1.0 to $8.0 \times 10^{-4}$ A/cm$^2$. The anodization is stopped before the changing rate per time unit of resistance of the anodized film reaches less than $7.0 \times 10^3$ $\Omega$·cm$^2$/sec.

Figure 12C:
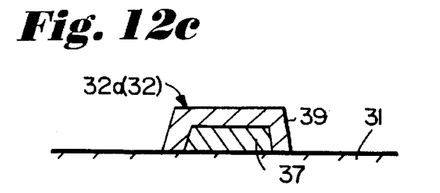

As a result, substantially the entire portion of the nitrogen-doped Nb layer 38 is converted into the anodized film 39. Thus, the gate electrode wiring 32 including the Nb layer 37 and the anodized film 39 is formed as is shown in FIG. 12c. Thereafter, the anodized film obtained in the above manner is heated preferably at a temperature in the range of 150° to 250° C. for 60 to 120 minutes, and in this case, 200° C. for 60 minutes.

Figure 12D:
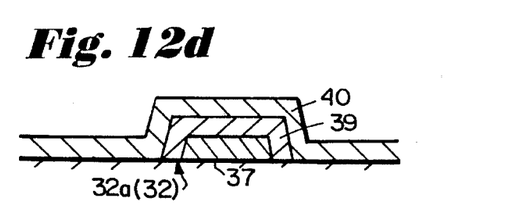

On the whole surface of the glass insulating plate 31 having the gate electrode wiring 32 including the gate electrode 32a, $SiN_x$ is deposited in a thickness of approximately 300 nm by use of a sputtering method or a CVD method to form a gate insulating film 40 as is shown in FIG. 12d.

Figure 12E:
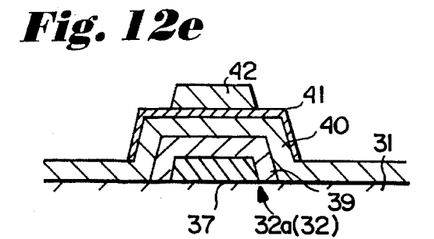

On the whole surface of the gate insulating film 40, a-Si and $SiN_x$ are sequentially deposited respectively in thicknesses of approximately 30 nm and 200 nm by use of a plasma CVD method. Then, by use of an etching method, a semiconductor layer 41 and an etching stop layer 42 are formed, as is shown in FIG. 12e.

Figure 12F:
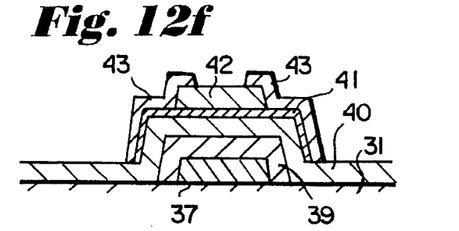

On the whole surface of the above-obtained lamination, phosphorus-doped a-Si is deposited in a thickness of approximately 100 nm by use of a plasma CVD method. Then, by use of an etching method, a-Si layers 43 are formed so as to cover the etching stop layer 42 except for a central top portion thereof and also to cover the semiconductor layer 41, as is shown in FIG. 12f.

Figure 12G:
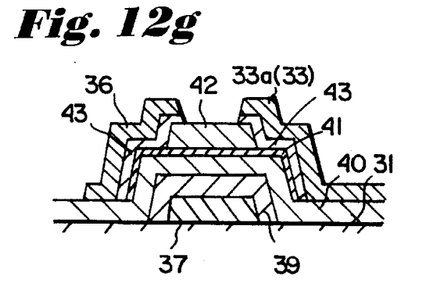

On the whole surface of the above-obtained lamination, Mo is deposited in a thickness of approximately 300 nm by use of a sputtering method. Then, by use of an etching method, a drain electrode 36 and the source electrode wiring 33 including the source electrode 33a are formed, as is shown in FIG. 12g.

Figure 12H:
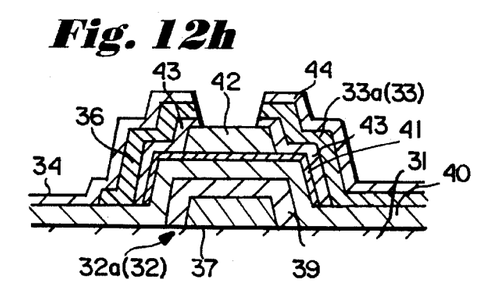

On the whole surface of the above-obtained lamination, indium tin oxide is deposited by use of a sputtering method. Then, by use of an etching method, the pixel electrode 34 is formed so as to partially overlap the drain electrode 36, and also an indium tin oxide film 44 is formed so as to partially overlap the source electrode 33a, as is shown in FIG. 12h.

Figure 12I:
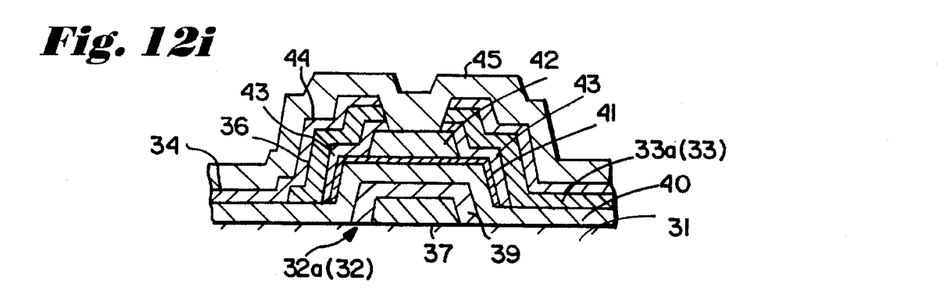

Finally, on the whole surface of the above-obtained lamination, $SiN_x$ is deposited by use of a plasma CVD method to form a protective film 45. In this way, the active matrix substrate having a TFT is produced as is shown in FIG. 12i.

The active matrix substrate produced in the above manner has an extremely low and stable specific resistance owing to the gate electrode wiring 32 mainly including Nb. Moreover, since the anodized Nb film is doped with nitrogen, the insulation thereof is high and the leak current is hardly generated.

Although the present invention is applied to a TFT in the first through fifth examples, the present invention may be applied to other semiconductor devices.

According to one aspect of the present invention, the electrode wiring is formed of an alloy of Ta and Nb, Nb, or a metal mainly including Nb. Since all of these materials are excellent in chemical resistance and etched only by a specific etchant as described above with reference to Table 1, the layer lamination is easily performed after the formation of the electrode wiring. This results in an excellent processability of a semiconductor device including such an electrode wiring.

An electrode wiring formed of Nb or a metal mainly including Nb has a much lower and more stable specific resistance than that of an electrode wiring formed of an alloy of Ta and Nb. On the other hand, an electrode wiring formed of an alloy of Ta and Nb is much more resistant against a mixed solution of hydrofluoric acid and nitric acid than that of Nb or a metal mainly including Nb.

According to another aspect of the present invention, the electrode wiring includes a lower layer formed of an alloy of Ta and Nb and an upper layer formed of Ta. This electrode wiring is more excellent in adhesion between the upper and lower layers than the one disclosed by Japanese Laid-Open Patent Publication No. 2-106723, which has the lower layer formed of Nb and the upper layer formed of Ta. For this reason, the electrode wiring according to the present invention allows for microscopic processing with high precision.

Further, the lower layer of an alloy of Ta and Nb according to the present invention is more resistant against a mixed solution of hydrofluoric acid and nitric acid than the upper layer of Nb according to the prior art. This prevents the lower layer from being etched more than the upper layer so that the upper layer will not overhang the lower layer. In addition, since the lower layer is as thin as 20 nm or less, the whole electrode wiring can be made sufficiently thin. Thus, the electrode wiring of the present invention having a two-layer structure can easily be coated with an insulating film.

Since the upper layer formed of Ta and the lower layer formed of an alloy of Ta and Nb can be etched by an identical type of etchant, the layer lamination is easily performed after the formation of the electrode wiring, which results in an excellent processability of a semiconductor device including this electrode wiring.

The electrode wiring according to the present invention may include an anodized film formed on the gate electrode wiring in addition to the gate insulating film. In a semiconductor device including such a two-layer insulating structure including the anodized film and the gate insulating film, generation of leak current is greatly reduced and thus the production yield is increased.

According to still another aspect of the present invention, the electrode wiring is formed of Nb or a metal mainly including Nb, and the anodization thereof is stopped before the changing rate per time unit of resistance of the anodized film reaches less than $7.0 \times 10^3$ $\Omega \cdot cm^2/sec$. Owing to this, dielectric breakdown of the anodized film can be prevented even at a formation voltage of 100 V or higher, thereby allowing the formation of the anodized film having a sufficient thickness.

According to still another aspect of the present invention, at least a portion of Nb, which will be anodized later, is deposited by use of at least one of the following methods: (1) a sputtering method in an atmosphere of an inert gas including nitrogen, and (2) a sputtering method in an inert gas atmosphere at a deposition rate of 2 nm/sec or less. Such methods for depositing Nb effectively lower the crystallinity of Nb in the above portion. Anodization of an electrode wiring including Nb having such a low crystallinity results in an anodized Nb film in which generation of microscopic crystals is greatly reduced. As a result, dielectric breakdown of the anodized Nb film can be prevented. Heat treatment of this anodized film, for example, at a temperature in the range of 150° to 250° C. for 60 to 120 minutes, further improves insulating characteristics of the anodized film.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:
   an insulating substrate; and an electrode wiring having a single layer structure provided on an area of the insulating substrate by sputtering, wherein the electrode wiring is formed of an alloy consisting essentially of Ta and Nb, wherein the alloy has a body-centered cubic structure.

2. A semiconductor device according to claim 1, further comprising an oxide film provided on a surface of the electrode wiring, the oxide film being formed by anodization of the electrode wiring.

3. A semiconductor device, comprising:

an insulating substrate; and an electrode wiring provided on an area of the insulating substrate by sputtering, the electrode wiring having a two-layer structure including a lower layer and an upper layer, the lower layer being closer to the insulating substrate than the upper layer, wherein the lower layer is formed of an alloy consisting essentially of Ta and Nb, wherein the alloy has a body-centered cubic structure, and the upper layer is formed of Ta having a body-centered cubic structure.

4. A semiconductor device according to claim 3, wherein the lower layer has a thickness of 20 nm at the maximum.

5. A semiconductor device according to claim 3, further comprising an oxide film provided on a surface of the electrode wiring, the oxide film being formed by anodization of the electrode wiring.

6. A semiconductor device, comprising:

an insulating substrate;

a gate electrode wiring having a single layer structure provided on an area of the insulating substrate by sputtering;

a gate insulating film provided on the surface of the insulating substrate having the gate electrode wiring;

a semiconductor layer provided on a part of the gate insulating film, the part being above the gate electrode wiring; and a source electrode and a drain electrode both partially overlapping the semiconductor layer, wherein the gate electrode wiring is formed of an alloy consisting essentially of Ta and Nb, wherein the alloy has a body-centered cubic structure.

7. A semiconductor device according to claim 6, further comprising an oxide film provided between the gate insulating film and the gate electrode wiring, the oxide film being formed by anodization of the gate electrode wiring.

8. A semiconductor device, comprising:

an insulating substrate;

a gate electrode wiring provided on an area of the insulating substrate by sputtering, the gate electrode wiring having a two-layer structure including a lower layer and an upper layer, the lower layer being closer to the insulating substrate than the upper layer;

a gate insulating film provided on the surface of the insulating substrate having the gate electrode wiring;

a semiconductor layer provided on a part of the gate insulating film, the part being above the gate electrode wiring; and a source electrode and a drain electrode both partially overlapping the semiconductor layer;

wherein the lower layer is formed of an alloy consisting essentially of Ta and Nb, wherein the alloy has a body-centered cubic structure, and the upper layer is formed of Ta having a body-centered cubic structure.

9. A semiconductor device according to claim 8, wherein the lower layer has a thickness of 20 nm at the maximum.

10. A semiconductor device according to claim 9, further comprising an oxide film provided between the gate insulating film and the gate electrode wiring, the oxide film being formed by anodization of the gate electrode wiring.

11. A liquid crystal display device including the semiconductor device of claim 7.

12. A liquid crystal display device including the semiconductor device of claim 10.

* * * * *